United States Patent
Zhan et al.

(10) Patent No.: US 9,583,603 B2
(45) Date of Patent: Feb. 28, 2017

(54) ESD PROTECTION WITH INTEGRATED LDMOS TRIGGERING JUNCTION

(71) Applicants: Rouying Zhan, Gilbert, AZ (US); Chai Ean Gill, Chandler, AZ (US); William G. Cowden, Gilbert, AZ (US); Changsoo Hong, Phoenix, AZ (US)

(72) Inventors: Rouying Zhan, Gilbert, AZ (US); Chai Ean Gill, Chandler, AZ (US); William G. Cowden, Gilbert, AZ (US); Changsoo Hong, Phoenix, AZ (US)

(73) Assignee: NXP USA, INC., Austin, TX (US)

( * ) Notice: Subject to any disclaimer, the term of this patent is extended or adjusted under 35 U.S.C. 154(b) by 74 days.

(21) Appl. No.: 13/764,523

(22) Filed: Feb. 11, 2013

(65) Prior Publication Data

US 2014/0225156 A1 Aug. 14, 2014

(51) Int. Cl.
| | |
|---|---|
| *H01L 29/73* | (2006.01) |
| *H01L 29/66* | (2006.01) |
| *H01L 27/02* | (2006.01) |
| *H01L 29/78* | (2006.01) |
| *H01L 29/735* | (2006.01) |
| *H01L 29/06* | (2006.01) |

(52) U.S. Cl.
CPC .......... *H01L 29/73* (2013.01); *H01L 27/0277* (2013.01); *H01L 29/66325* (2013.01); *H01L 29/7835* (2013.01); H01L 29/0653 (2013.01); H01L 29/735 (2013.01)

(58) Field of Classification Search
CPC .................................................. H01L 27/0248
USPC ......................................................... 257/173
See application file for complete search history.

(56) References Cited

U.S. PATENT DOCUMENTS

| | | | |
|---|---|---|---|
| 7,786,507 B2 * | 8/2010 | Denison et al. ............... | 257/173 |
| 2009/0045457 A1 * | 2/2009 | Bobde ................. | H01L 27/0255 257/328 |
| 2010/0019341 A1 | 1/2010 | Gill et al. | |
| 2010/0187608 A1 * | 7/2010 | Risaki ................. | H01L 27/0259 257/355 |
| 2010/0320501 A1 | 12/2010 | Gendron et al. | |
| 2011/0175198 A1 | 7/2011 | Zhan et al. | |
| 2011/0176243 A1 | 7/2011 | Zhan et al. | |
| 2011/0176244 A1 * | 7/2011 | Gendron et al. ................. | 361/56 |
| 2012/0119331 A1 | 5/2012 | Gendron et al. | |

* cited by examiner

*Primary Examiner* — Kenneth Parker
*Assistant Examiner* — Christopher Culbert (57) ABSTRACT

An electrostatic discharge (ESD) protection device includes a semiconductor substrate, a base region in the semiconductor substrate and having a first conductivity type, an emitter region in the base region and having a second conductivity type, a collector region in the semiconductor substrate, spaced from the base region, and having the second conductivity type, a breakdown trigger region having the second conductivity type, disposed laterally between the base region and the collector region to define a junction across which breakdown occurs to trigger the ESD protection device to shunt ESD discharge current, and a gate structure supported by the semiconductor substrate over the breakdown trigger region and electrically tied to the base region and the emitter region. The lateral width of the breakdown trigger region is configured to establish a voltage level at which the breakdown occurs.

21 Claims, 5 Drawing Sheets

ESD PROTECTION WITH INTEGRATED LDMOS TRIGGERING JUNCTION

FIELD OF INVENTION

The present embodiments relate to semiconductor devices.

BACKGROUND

Integrated circuits (ICs) are at risk of damage due to electrostatic discharge (ESD) events. ESD events may be caused by an electrostatically charged person holding an IC chip. An ESD event may involve electrostatic potentials of 4000 Volts or more between input/output (I/O) terminals of the IC chip. During the ESD event, a discharge current typically flows between the I/O terminal and ground through vulnerable circuitry in the IC chip.

ESD protection devices are commonly incorporated into IC chips across terminals of the IC chip. ESD protection devices are often configured to protect such circuitry by providing another path to ground for the discharge current. For example, an ESD protection device may be connected between an I/O terminal and a ground or common terminal. The ESD protection device acts as a voltage limiter to prevent the voltage between the I/O terminal and the ground terminal from reaching levels that would otherwise harm other devices on the chip.

ESD protection devices are configured to remain quiescent while the voltage between the terminals falls within a normal operating range for the IC chip. When the voltage reaches a triggering voltage above that range, the ESD protection device turns on to shunt any damaging current to ground, thereby preventing damage to the IC chip. The triggering voltage of the ESD protection device should exceed the maximum normal operating voltage of the IC chip to avoid interfering with the normal operation of the IC chip.

BRIEF DESCRIPTION OF THE DRAWINGS

The components and the figures are not necessarily to scale, emphasis instead being placed upon illustrating the principles of the various embodiments. Moreover, in the figures, like reference numerals designate corresponding parts throughout the different views.

DETAILED DESCRIPTION OF THE PRESENTLY PREFERRED EMBODIMENTS

Embodiments of electrostatic discharge (ESD) protection devices, such as ESD protection clamps, and electronic apparatus including such clamps or devices, are described. The ESD protection devices have a breakdown trigger region that defines a breakdown trigger junction for the ESD protection device. The breakdown trigger region may define the breakdown trigger junction in a manner that emulates, matches or otherwise corresponds with a blocking junction (or other junction across which breakdown may occur) in the protected devices of the electronic apparatus, such as power field effect transistor (FET) devices. For example, the breakdown trigger region may define the breakdown trigger junction of the ESD protection device to emulate a blocking junction of a laterally diffused metal oxide semiconductor (LDMOS) transistor device. Some embodiments may thus include an integrated LDMOS breakdown triggering junction. One or more additional aspects of the disclosed embodiments may also involve integration of components of an LDMOS transistor device into the disclosed ESD protection devices. For example, the disclosed ESD protection devices may include one or more gate structures over the breakdown trigger region(s) to further match or emulate the operational characteristics of the blocking junction of the LDMOS transistor devices being protected via the disclosed embodiments.

The breakdown trigger region may be configured to establish a breakdown trigger voltage level appropriate relative to an operating area for the other devices of the electronic apparatus. The operating area for the other devices establishes an ESD design window for the disclosed protection devices. The ESD design window, in turn, establishes that a triggering voltage Vt1 of the ESD protection devices is lower than the breakdown voltage of the protected devices to protect such devices from damage, but higher than the operating voltage of the protected devices to avoid interrupting normal operation via a false trigger.

With the matching configurations of the breakdown trigger junction and the blocking junction, any shifts in the operating area of the protected devices due to, for instance, process variation, may be mirrored in a corresponding shift in the breakdown trigger voltage level of the ESD protection devices. A reduction in the size of the ESD design window may thus be avoided. The triggering voltage Vt1 of the disclosed ESD protection devices may thus remain within the ESD design window. The disclosed ESD protection devices may thus be configured to protect the other devices on an IC chip without interrupting the normal operation of the devices.

The disclosed ESD protection devices may avoid the problems presented by a triggering junction that differs from the junction that controls the breakdown of the protected devices. For instance, the disclosed embodiments may avoid scenarios in which the triggering voltage Vt1 and the breakdown voltage level of the protected device shift independently of one another due to process variation. Worst case scenarios in which the triggering voltage Vt1 shifts higher and the breakdown voltage level of the protected devices shifts lower (thereby reducing the size of the ESD window and, thus, the protection margin, from both directions) may also be avoided.

An example of a reduced ESD design window is as follows. A 40 Volt LDMOS device configured for a typical breakdown voltage of 60 Volts may be protected by an ESD clamp device having a triggering voltage Vt1 of about 48 Volts. Process variation shifts of 10% in each voltage level lead to a breakdown voltage level of 54V and a triggering voltage Vt1 of 52.8V, leaving very little margin for the ESD clamp to protect the 40V LDMOS device.

The disclosed embodiments may avoid a reduction in the ESD design window by configuring the breakdown trigger junction to emulate the blocking junction of the protected devices. Such emulation may maintain a proper protection margin by ensuring that the triggering voltage Vt1 shifts in the same direction as the breakdown voltage level of the protected devices.

The disclosed embodiments may be used to protect a variety of semiconductor devices having a wide range of operating voltages. For example, in some embodiments, including some of those in which the protected devices include LDMOS transistor devices, the pins of the IC chip may be rated for operation at voltages as low as about 5 Volts to as high as about 105 Volts. The disclosed embodiments may be configured to accommodate such wide ranges of operating voltages via stacking or other serial arrangements of the disclosed ESD protection devices, as described below. The disclosed ESD protection devices may thus be used to accommodate different operating voltages on the same IC chip. Different operating voltages may alternatively or additionally be accommodated by varying the configuration (e.g., lateral width) of the breakdown triggering region, as described below.

In some embodiments, the disclosed embodiments include or are configured as dual polarity or bidirectional ESD protection devices. The bidirectional ESD protection may be symmetrical in the sense that breakdown occurs in the forward and reverse directions at the same voltage level. Alternatively, the breakdown triggering regions of the disclosed devices may be configured to establish a different breakdown triggering voltage in the forward and reverse directions, as described below.

The disclosed embodiments may include a pair of bipolar junction transistor (BJT) devices (e.g., NPN BJT devices) connected to respective terminals between which the ESD event occurs to provide the bidirectional protection. The pair of BJT devices may share a common collector region. The BJT devices may be formed via a number of implantation procedures configured to form various regions of a power FET device, such as an LDMOS device. For example, drain/source implants may be used to form contact regions for a base region of each BJT device and the common collector region, as well as an emitter region for each BJT device. The base region may be formed by a high voltage well implant configured to form a body region of an LDMOS device. The collector region may be formed by a combination of LDMOS implants, including a high voltage well implant configured to form a drift region and a deep well implant used for device isolation.

The ESD protection devices of the disclosed embodiments may be configured for robust operation via the formation of a parasitic silicon controlled rectifier (SCR) device once the ESD event occurs. The SCR device may result from the presence of a parasitic BJT device (e.g., a PNP BJT device) formed by the pair of BJT devices. The formation of the parasitic BJT device may be based on the isolation resulting from the collector region reaching a buried doped isolating layer, which may be constructed via a power FET implant configured to provide power FET device isolation.

Although described below in connection with embodiments having an integrated LDMOS blocking junction, the disclosed embodiments may be configured to emulate, match or correspond with other types of FET devices. For example, the disclosed embodiments may be useful in connection with electronic apparatus having BiCMOS or other CMOS transistor devices.

Although described below in connection with NPN transistor devices, the disclosed devices are not limited to any particular transistor dopant configuration. The disclosed devices are not limited to NPN devices, as PNP and other types of devices may be provided by, for example, substitution of semiconductor regions of opposite conductivity type. Thus, for example, each semiconductor region, layer or other structure in the examples described below may have a conductivity type (e.g., n-type or p-type) opposite to the type identified in the examples below.

Figure 1:
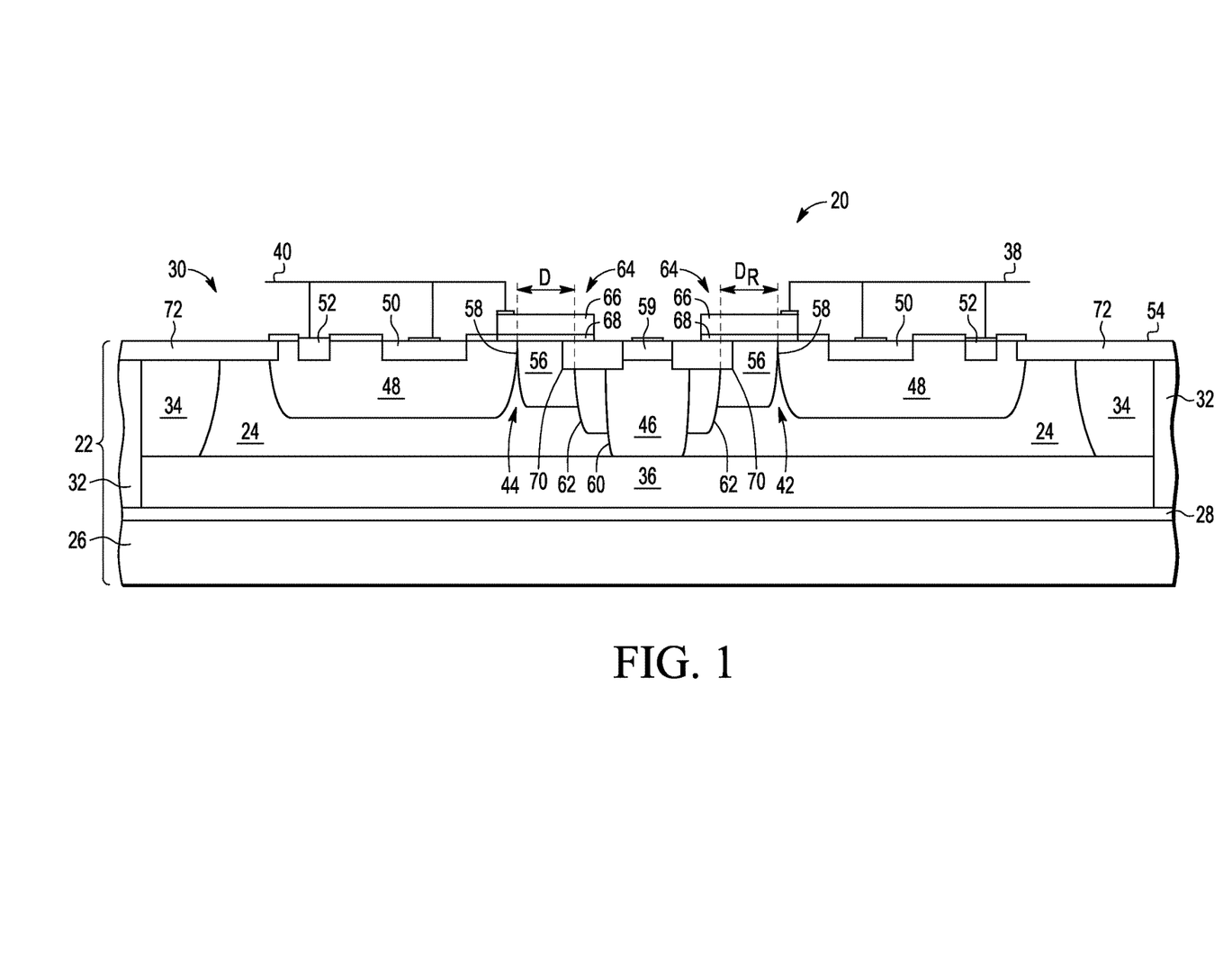
FIG. 1 is a cross-sectional, schematic, partial view of an exemplary ESD protection device with a breakdown trigger region configured to define a breakdown trigger junction in accordance with one embodiment.

FIG. 1 is a schematic cross-sectional view of an example of an ESD protection device 20 constructed in accordance with one embodiment. The device 20 includes a semiconductor substrate 22, which may, in turn, include a number of epitaxial layers 24. In this example, the semiconductor substrate 22 includes a single p-type epitaxial layer 24 grown on an original substrate 26. The original substrate 26 may be a heavily doped n-type semiconductor substrate, but a p-type substrate may also be used. The doping concentration level of the original substrate 26 may also vary, and need not be heavily doped. The device 20 may alternatively or additionally include non-epitaxial layers in which one or more device regions are formed. Any one or more of the layers of the semiconductor substrate 22 may include silicon. Alternative or additional semiconductor materials may be used in other embodiments.

The substrate 22 may include a buried oxide layer 28 between the original substrate 26 and the epitaxial layer(s) 24. In some cases, the original substrate 26 and the buried oxide layer 28 may correspond with the silicon and insulator layers of a silicon-on-insulator (SOI) substrate.

The structural, material, and other characteristics of the semiconductor substrate 22 may vary from the example shown. For example, the semiconductor substrate 22 need not include a silicon-on-insulator (SOI) construction. Additional, fewer, or alternative layers may be included in the semiconductor substrate 22. For example, the buried oxide layer 28 need not be present in some embodiments (see, e.g., the exemplary embodiment of FIG. 3). Any number of additional semiconductor and/or non-semiconductor layers may be included. The disclosed devices are thus not limited to, for instance, bulk silicon substrates or substrates including epitaxially grown layers, and instead may be supported by a wide variety of other types of semiconductor substrates.

A device area 30 of the device 20 is depicted in the cross-section of FIG. 1. In this example, a lateral perimeter of the device area 30 is defined by one or more deep trench isolation (DTI) regions 32 in the epitaxial layer(s) 24. The DTI region(s) 32 may include an insulating material, such as $SiO_2$. The construction, materials, and other characteristics of the DTI region(s) 32 may vary. For example, the DTI region(s) 32 may be formed by etching the semiconductor material of the epitaxial layer(s) 24. The DTI region(s) 32 may isolate the device area 30 from the surrounding substrate 22 by laterally surrounding the device area 30 and extending downward to reach the depth of the buried oxide layer 28 or other device isolating layer.

The device area 30 may alternatively or additionally be defined by one or more doped device isolating regions 34 in the semiconductor substrate 22 (e.g., the epitaxial layer 24). In this example, the doped isolating region(s) 34 include an n-type well disposed inward of the DTI region(s) 32 to laterally surround the device area 30. As described below, the doped isolating region(s) 34 may be formed via a combination of implants used to form components of the other devices in the semiconductor substrate 22 protected by the ESD protection device 20.

The ESD protection device 20 may include a buried doped isolating layer 36. In this example, the buried doped isolating layer 36 is an n-type buried layer (NBL) disposed above the buried oxide layer 28. The NBL 36 may be formed or disposed in the original substrate 26 before the growth of the epitaxial layer(s) 24. In this embodiment, the NBL 36 extends laterally across (e.g., under) the device area 30 to act as a barrier or isolation layer separating the device area 30 from the original substrate 26.

The NBL 36 may be configured for purposes other than substrate isolation. The NBL 36 may alternatively or additionally be configured to establish a desired current capacity for the ESD protection device 20 through the formation of a parasitic SCR device. The isolating properties of the NBL 36 may be directed to forming the parasitic SCR device by electrically separating components of the ESD protection device 20 from one another, as described below.

The NBL 36 is disposed in the semiconductor substrate 22 at a depth reached or reachable by the doped device isolating region(s) 34. The doped device isolating regions 34 and the NBL 36 may together form an isolation tub for the ESD protection device 20. The isolation tub may be ring-shaped. Additional, fewer, or alternative doped device isolating layers or regions may be provided in the semiconductor substrate 22. Please see, for example, the exemplary embodiment of FIG. 2 described below.

The ESD protection device 20 may be part of an electronic apparatus having a number of terminals across which an ESD event may occur. The terminals may be or include any type of input/output (I/O) terminal, such as pins or pads. In this example, the electronic apparatus includes an anode terminal 38 and a cathode terminal 40. The cathode terminal 40 may correspond with a common or ground terminal of the electronic apparatus. However, the references to "anode" and "cathode" are provided only for convenience in description of the bidirectional nature of the ESD protection device 20. As a dual polarity or bidirectional device, the ESD protection device 20 is configured to shunt ESD discharge current between the terminals 38, 40 (and away from the protected devices of the electronic apparatus) regardless of which I/O terminal is positive or negative.

In addition to the pads, pins, or other outward facing components thereof, the anode and cathode terminals 38, 40 include one or more metal layers, interconnects, or other conductive connections, supported by the semiconductor substrate 22 and passivated by one or more dielectric layers (not shown). Such metal layers, interconnects, or connections are depicted schematically in FIG. 1.

The ESD protection device 20 is configured as a dual polarity device in which the anode and cathode terminals 38, 40 are coupled to a pair of BJT devices 42, 44. The BJT device 42 and the BJT device 44 are coupled to the anode and cathode terminals 38, 40, respectively. In the embodiment of FIG. 1, the BJT devices 42, 44 are configured as NPN BJT devices. During operation, the BJT device 44 is configured to breakdown in response to forward polarity ESD events in which the anode terminal 38 is positive biased with reference to the cathode terminal 40. The BJT device 42 is configured to breakdown upon experiencing reverse polarity ESD events in which the anode terminal 38 is negative biased with reference to the cathode terminal 40. The ESD protection device 20 may be symmetrically configured. For example, in some cases, the pair of BJT devices 42, 44 are configured such that the breakdown trigger voltage level Vt1 is the same for both the forward and reverse polarities. As described below, the ESD protection device 20 may be asymmetrically configured, in which case the forward and reverse trigger voltage levels may differ.

In the symmetrical embodiment of FIG. 1, the BJT devices 42, 44 share a common collector region 46 in the semiconductor substrate 22 (e.g., the epitaxial layer(s) 24). The collector region 46 may be centrally disposed between the other regions or components of the BJT devices 42, 44. In this example, the collector region 46 includes an n-type well (e.g., a deep n-type well) that reaches and is electrically connected to the NBL 36. On either lateral side of the collector region 46, each BJT device 42, 44 includes a respective base region 48 and an emitter region 50 within the base region 48. The base and emitter regions 48, 50 are electrically tied or otherwise connected to a respective one of the terminals 38, 40. In this example, each base region 48 includes a p-type well in which a base contact region 52 is formed at a surface 54 of the semiconductor substrate 22. Each emitter region 50 includes an n-type region at the surface 54. The base contact region 52 and the emitter region 50 are highly doped to establish or support an Ohmic contact or other low resistance connection to the terminals 38, 40.

The BJT devices 42, 44 include a respective breakdown trigger region 56 in the semiconductor substrate 22 laterally disposed between the base region 48 and the common collector region 46. In this example, each breakdown trigger region 56 includes an n-type well that abuts the p-type well of the base region 48. Alternatively, the n-type well of the breakdown trigger region 56 is spaced from the p-type well of the base region 48. A portion of the epitaxial layer 24 may thus be disposed between the breakdown trigger region 56 and the base region 48. In either case, the presence of the breakdown trigger region 56 defines a junction 58 across which breakdown occurs to trigger the ESD protection device 20. The junction 58 may be established between the breakdown trigger region 56 and the p-type well of the base region 48 (and/or involve a portion of the epitaxial layer 24). The breakdown trigger region 56 abuts the common collector region 46 along a lateral boundary of the breakdown trigger region 56. In this example, the breakdown trigger region 56 abuts the outer region 62 of the common collector region 46.

A lateral width D (or $D_R$ for the reverse polarity) of the breakdown trigger region 56 establishes a voltage level at which the breakdown occurs. In this example, the lateral width D extends from a lateral boundary of the outer region 62 to the base region 48. In some embodiments, the lateral width may range from 0 to about 3.5 μm in ESD protection devices. In other embodiments, the lateral width may range from about −0.5 μm to about 5 μm. Further details regarding customization of the lateral width of the breakdown trigger region 56 are provided below in connection with FIG. 4.

The dopant concentration level of the n-type well of the breakdown trigger region 56 may be higher than a dopant concentration level of the epitaxial layer 24 in which the breakdown trigger region 56 is formed. For example, the breakdown trigger region 56 may have a dopant concentration of about $5 \times 10^{16}/cm^3$, while the p-type epitaxial layer 24 may have a dopant concentration level of about $2 \times 10^{15}/cm^3$. The higher dopant concentration level may be useful in establishing a higher breakdown voltage level for a given spacing (e.g., lateral width of the breakdown trigger region 56), thereby decreasing the footprint of the ESD protection device 20. Use of the n-type well of the breakdown trigger region 56 instead of the p-type epitaxial layer 24 may also support a lower on-resistance level for the LDMOS device, which may have accumulation and drift regions that mirror the breakdown trigger region 56. The breakdown trigger region 56 is configured to be fully depleted of free carriers when the breakdown occurs. For example, the doped isolating well(s) 34, the NBL 36, and the various regions of the common collector region 46 may have higher dopant concentration levels than the breakdown trigger region 56.

As described below, the collector, base, emitter, and breakdown trigger regions 46, 48, 50, 56 may be formed via one or more respective power FET implants. In some cases, such regions may be composite regions formed by multiple power FET implants. In this embodiment, the collector region 46 is one such composite region. The collector region 46 may be a composite region, in the sense that the collector region 46 is formed via a combination of multiple well regions. In addition to a collector contact region 59 at the surface 54, the collector region 46 includes an inner well region 60 (e.g., a deep well region) in which the collector contact region 59 is disposed, and an outer well region 62 formed via respective power FET implants. The outer well region 62 is disposed laterally adjacent and electrically connected to the inner well region 60. The outer well region 62 may flank the inner well region 60. As described below, the inner well region 60 may be formed by a combination of various n-type power FET implants, including, e.g., those that form the doped isolating region(s) 34. The outer well region 62 may be formed by a subset of those n-type power FET implants. For example, the mask for a deep n-type well implant may pattern the inner and outer well regions 60, 62 such that a lower boundary of the inner well region 60 is deeper than a lower boundary of the outer well region 62. The inner well region 60 may thus reach and be electrically connected to the NBL 36, while the outer well region 62 may or may not reach the NBL 36. The implant used to form the breakdown trigger region 56 may be configured with a mask pattern that leads to doping a central portion of the device area 30, including both the breakdown trigger region 56 and the common collector region 46.

The breakdown trigger region 56 may be formed via one or more power FET implants configured to form one or more regions of a conduction path of the protected power FET device in which charge carriers accumulate, drift, or otherwise flow after exiting an inversion channel of the power FET device formed during operation. The conduction path region may thus include one or more non-inverting regions or portions of a conduction path of the power FET device, such as an accumulation region of the power FET device. Non-inverting portions or regions of the conduction path of the power FET device may correspond with regions of the semiconductor substrate through which charge carriers are accumulating and/or moving (e.g., drifting) during conduction between the source and drain regions, other than a channel or other region in which charge inversion occurs as a result of a gate bias voltage. For example, the power FET implant(s) may include an n-type implant configured to form a well region laterally disposed between the body and drain regions of the protected power FET device. The use of the power FET implant(s) to form the breakdown trigger region 56 allows the ESD protection device 20 to be configured such that the junction that breaks down in the ESD protection device 20 mirrors, matches, or otherwise corresponds with the blocking junction in the power FET device. Further details regarding the blocking junction, the well region, the accumulation region, and other features of the power FET device are shown and described in connection with the exemplary embodiment of FIG. 6. By mirroring the blocking junction, process variations that shift the operating area (e.g., breakdown voltage) of the power FET devices result in a corresponding shift in the breakdown trigger voltages of the ESD protection device 20. The corresponding shift is in the same direction as the shift in the protected device, and may involve a change in magnitude of a similar or same extent. For example, a process variation that adjusts the location or dopant concentration of the n-type well that forms the accumulation and/or drift region of the power FET device correspondingly adjusts the location or dopant concentration of the breakdown trigger region 56 of the ESD protection device 20.

In some embodiments, both sides of the breakdown trigger junction 58 in the ESD protection device 20 may be configured to emulate the protected power FET device. As described above, the n-type sides of the junctions are matched as a result of using the same n-type well implant to form the breakdown trigger region 56 and the power FET accumulation region. On the p-type side of the junctions 58, the p-type well implant that forms the base region 48 also forms the body of the power FET device. The configuration of the breakdown trigger junction 58 may thus be considered to integrate an LDMOS (or other power FET) device junction into the ESD protection device 20. Alternatively, the implant masks for the regions on one or both of the sides of the breakdown junction 58 or the power FET blocking junction may deviate to a desired extent from the other. For example, the implant masks may be adjusted to leave a portion (e.g., a desired lateral width) of the epitaxial layer 24 (not doped by the implants forming the base region 48 and the breakdown trigger region 56) along one or both of the junctions. The breakdown trigger region 56 and the base region 48 need not abut as shown or be configured line-on-line.

The operational characteristics of the junctions may be further matched by configuring the surface 54 of the semiconductor substrate 22 in the device area 30 in a manner similar to the configuration of the protected power FET devices. In the embodiment of FIG. 1, the ESD protection device 20 includes a respective gate structure 64 for each BJT device 42, 44 that matches or otherwise corresponds with the gate structures of the protected power FET devices. The gate structure 64 is supported by the semiconductor substrate 22 over the breakdown trigger junction 58. The gate structure 64 may be configured similarly to the gate structures of the protected power FET devices. For example, the gate structure 64 may include a conductive layer 66 (e.g., a polysilicon layer) over a gate oxide layer 68. The thickness of the gate oxide layer 68 may differ from the thickness of the corresponding gate oxide layer in the protected power FET devices. For example, the thickness may fall in a range from about 2 nm to about 20 nm, to ensure that the gate structure 64 is protected during an ESD event, but other thicknesses may be used.

The gate structures 64 are electrically connected to a respective one of the terminals 38, 40. As a result, the gate structures 64 are not floating during an ESD event relative to the voltage at the terminals 38, 40.

The gate structures 64 are also electrically connected to the base and emitter regions 48, 50 of the respective BJT device of the pair of BJT devices 42, 44. One or more metal lines, interconnects, or other links may be used to establish the electrical connections between the respective terminal 38, 40, the conductive layer 66 of the gate structure 64, the base contact region 52, and the emitter region 50. These electrical connections may be directed to emulating the shorting or electrical connection of the gate and source of the protected power FET devices (e.g., n-type LDMOS devices). Further details regarding the gate and source of the protected power FET device are shown and described below in connection with FIG. 6. The presence of the gate structures 64 (or other structures at the surface 54) may thus maintain the integrity of the surface charge concentration at or near the breakdown trigger regions 56. The gate structures 64 may also prevent modifications to the breakdown trigger regions 56 that would otherwise occur from subsequent processing steps. It may be useful to avoid such modifications to avoid deviating from the characteristics or configuration of the surface at the blocking junction of the protected power FET devices.

In the embodiment of FIG. 1, the gate structure 64 extends across an entire extent of the lateral width of the breakdown trigger region 56. The voltage level of the gate structure 64 controls the extent to which charge carriers are present at the surface 54 within the breakdown trigger region 56. In contrast, the gate structure 64 may be laterally spaced from the emitter region 50 to ensure that no channel forms under the gate structure 64 even if a relatively positive voltage is applied thereto. The lateral spacing between the gate structure 64 and the emitter region 50 may vary. For example, the gate structure 64 may have an increased lateral spacing than the example shown in FIG. 1. In such cases, the gate structure 64 may extend further over the BJT device 42, 44 to act as a field plate to control surface charges in varying amounts of the base region 48, the emitter region 50, and/or the collector region 46.

A number of shallow trench isolation (STI) regions 70 may be formed at the surface 54 in the semiconductor substrate 22. In this embodiment, the STI region 70 is disposed laterally adjacent to the collector contact region 59. A portion of the STI region 70 may laterally extend under the gate structure 64. The presence of the STI region 70 under the gate structure 64 may be configured to match or otherwise correspond with the STI regions in the drift and/or accumulation regions of a power FET device. For example, the STI region 70 may laterally overlap the breakdown trigger region 56 to match the extent to which the STI region overlaps the accumulation region of the power FET device. In such cases, the lateral width of the breakdown trigger region 56 includes a component under the STI region 70, which may be used as a design parameter to adjust the breakdown trigger voltage level.

Other STI regions may be disposed in the semiconductor substrate 22 to isolate the ESD protection device 20 from the semiconductor substrate 22. In this example, an STI region 72 may be disposed along the lateral boundary of the device area 30. The STI region 72 may laterally extend from the DTI region 32 to the base region 48. The depth of the STI region 72 may be in a range from about 0.1 μm to about 0.5 μm.

The common collector region 46 is electrically coupled to the NBL 36. To reach the NBL 36, the inner region 60 may include a doped isolating well formed via the same implant(s) that may be used to form the doped isolating wells 34. A lower boundary of the doped isolating well and/or the common collector region 46 may thus reach the depth of the NBL 36. In comparison, the lower boundary of the breakdown trigger region 56 is shallower than the depth at which the doped isolating well of the common collector region 46 reaches the NBL 36.

During operation in forward polarity, when a positive ESD stress is applied to the anode terminal 38 with reference to the cathode terminal 40, the NPN BJT device 42 acts as a forward-biased diode. The junction 58 of the other NPN BJT device 44 is reverse-biased, and the breakdown trigger voltage Vt1 of the ESD protection device 20 is determined by the collector-to-base spacing, or lateral width D, provided by the breakdown trigger region 56 in the NPN BJT device 44. With an applied voltage larger than the breakdown trigger voltage level Vt1, the NPN BJT device 44 turns on, thereby forming a parasitic silicon controlled rectifier (SCR) device with a parasitic PNP BJT device, an example of which is shown schematically in FIG. 4 as PNP BJT device Q3 (depicted with alternate collectors depending on the polarity of the ESD event). The parasitic SCR device provides strong ESD robustness for the disclosed ESD protection device 20. In reverse polarity operation, when a negative stress is applied to the anode terminal 38 with reference to the cathode terminal 40, the NPN BJT device 44 acts as a forward-biased diode. The reverse breakdown trigger voltage level Vt1 of the ESD protection device 20 is determined by the collector-to-base spacing, or lateral width $D_R$, provided by the breakdown trigger region 56 in the NPN BJT device 42.

The ESD protection device 20 is configured such that the voltage level at the common collector region 46 and the NBL 36 floats. The common collector region 46, the NBL 36, and the doped isolating region(s) 34 are not electrically tied or connected to either of the terminals 38, 40. The electrical connection of the common collector region 46 and the NBL 36 isolates the p-type wells of the respective base regions 48 of the pair of BJT devices 42, 44. In the embodiment of FIG. 1, each base region 48 is isolated or electrically separated from the base and emitter regions 48, 50 of the other BJT device 42, 44. Such isolation allows one of the p-type wells to form the forward-biased diode during operation. The diode is formed between the p-type well of the base region 48 and the NBL 36. The p-type side of the diode may also include a portion of the epitaxial layer 24. The diode is formed on the side electrically tied or connected to the terminal 38, 40 having the relatively higher voltage.

Once a forward biased diode is established on one side, the common collector region 46 and the NBL 36 may reach a voltage level that depletes the breakdown trigger region 56. Eventually such depletion leads to an ESD event involving breakdown of the junction 58. Using a forward breakdown event as an example, the ESD event forms the parasitic SCR device to shunt the ESD discharge current between the terminals 38, 40. The SCR device provides strong current capability for this device, which may be useful in, for instance, supporting a suitable thermal snapback point (e.g., a high thermal snapback current level It2) for a given size of the ESD protection device 20. In a forward ESD event (with the terminal 38 as the anode), charge carriers (e.g., electrons) are shunted from the cathode terminal 40 and the emitter region 50 of the NPN BJT device 44 to the base region 48 and the anode terminal 38 of the NPN BJT device 42, as described below.

Figure 4:
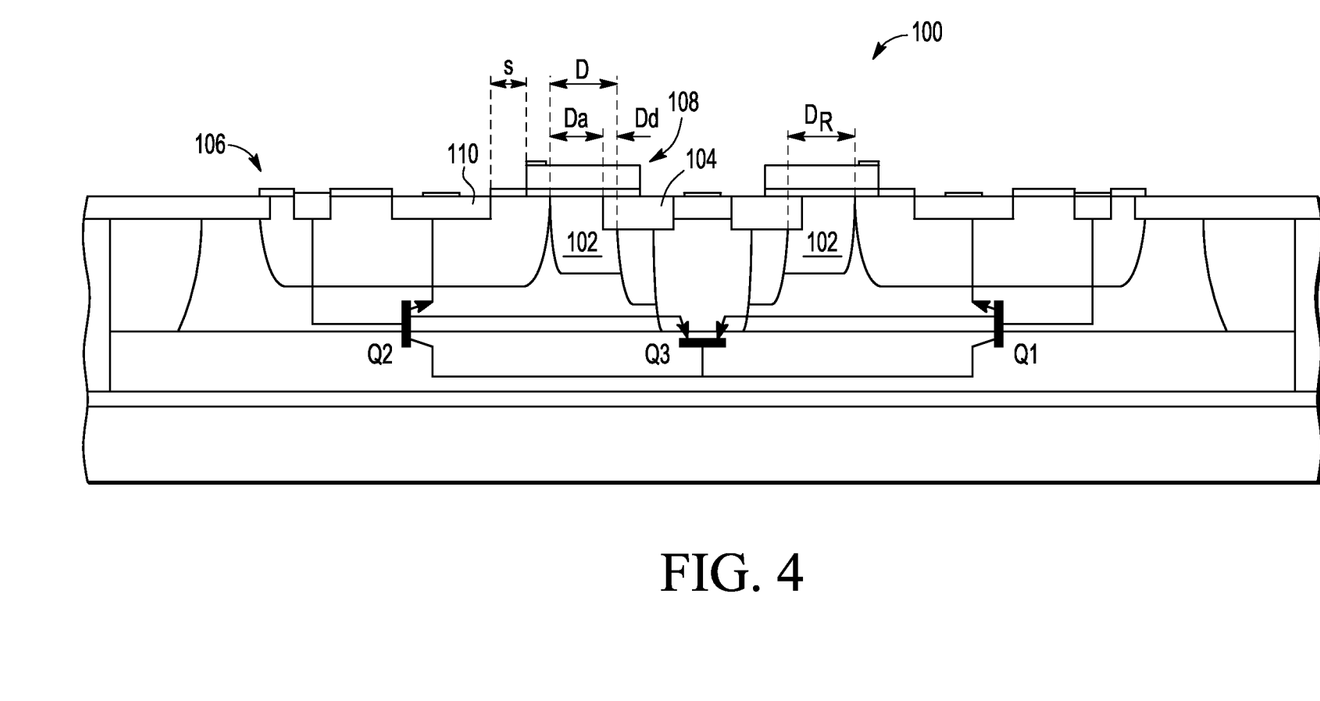
FIG. 4 is another cross-sectional, schematic, partial view of the exemplary ESD protection device of FIG. 1 to depict various configuration parameters and operational characteristics in greater detail.

The parasitic SCR device includes the collector region 46 (including the NBL 36), the base region 48, and the emitter region 50 of the NPN BJT device 44, and the p-type well of the base region 48 of the NPN BJT device 42. As shown in FIG. 4, the parasitic SCR device may be considered to include a parasitic PNP BJT device Q3 formed via the above-referenced p-type regions (e.g., the p-type well regions of the base regions and the p-type epitaxial layer) and the n-type common collector region 46 and the NBL 36.

In a reverse ESD event, the contributions of the above-referenced regions of the NPN BJT devices 42, 44 are reversed. For example, the base region 48 of the NPN BJT device 44 forms the forward biased diode with the NBL layer 36, and breakdown occurs at the junction 58 along the base region 48 of the NPN BJT device 42. The ESD protection device 20 of FIG. 1 is thus configured as a dual polarity ESD protection device.

The forward and reverse breakdown trigger voltages Vt1 of the ESD protection device are thus determined by the lateral widths D and $D_R$ of the breakdown trigger regions 56, respectively. The lateral widths correspond with the distances or spacing between the collector and base regions 46, 48, as described above. The lateral widths are measured from the lateral edge of the outer region 62 to the inner lateral edge of the p-type well of the base region 48. As described herein, the presence of the n-type well in that spacing is directed to emulating the junction that controls the drain-to-source breakdown of the protected power FET devices, such as an n-type LDMOS device.

The various doped isolating layers (e.g., the regions 34 and/or the NBL 36), the buried oxide layer 28, and/or the DTI regions 32 also isolate the ESD protection device 20 from the semiconductor substrate 22. As a result, the ESD protection device may be stackable. For example, multiple ESD protection devices may be arranged in series to form a multi-device ESD clamp having a breakdown trigger voltage level Vt1 that approximately equals or otherwise corresponds with the sum of the individual trigger voltage levels Vt1. The series arrangement may involve connecting the anode electrodes of a top (or upper) ESD protection device to a pin or other I/O terminal, connecting the cathode electrodes of the top ESD protection device to the anode electrodes of a bottom (or lower) ESD protection device, and connecting the cathode electrodes of the bottom ESD protection to ground or another I/O terminal (or another ESD protection device). In one example with two ESD protection devices each having trigger voltage levels of 40 Volts, the stacked or series arrangement provides a trigger voltage level of 80 Volts. Different pins on the same IC chip may thus have differing ESD protection levels. The voltage level of the snapback point Vsb for the ESD clamp may also approximately equal the sum of the individual snapback voltage levels. Further details regarding the stacking of ESD clamps or other protection devices are provided in U.S. Patent Publication No. 2011/0176243.

The breakdown trigger region 56 and the base region 48 need not be line on line. The regions may be spaced apart to any desired extent. For example, the regions may be spaced apart to an extent that matches a distance or spacing between the body region and accumulation region of a protected LDMOS device. The breakdown trigger region 56 and the base region 48 may thus be separated by a portion of the epitaxial layer 24 to the same extent that a portion of an epitaxial layer remains disposed between the body and accumulation regions of the protected LDMOS device.

In the embodiment of FIG. 1, the NBL 36 extends laterally across the base, emitter, and collector regions of each of the NPN BJT devices 42, 44. The NBL may thus extend laterally across the entire device area 30.

Figure 2:
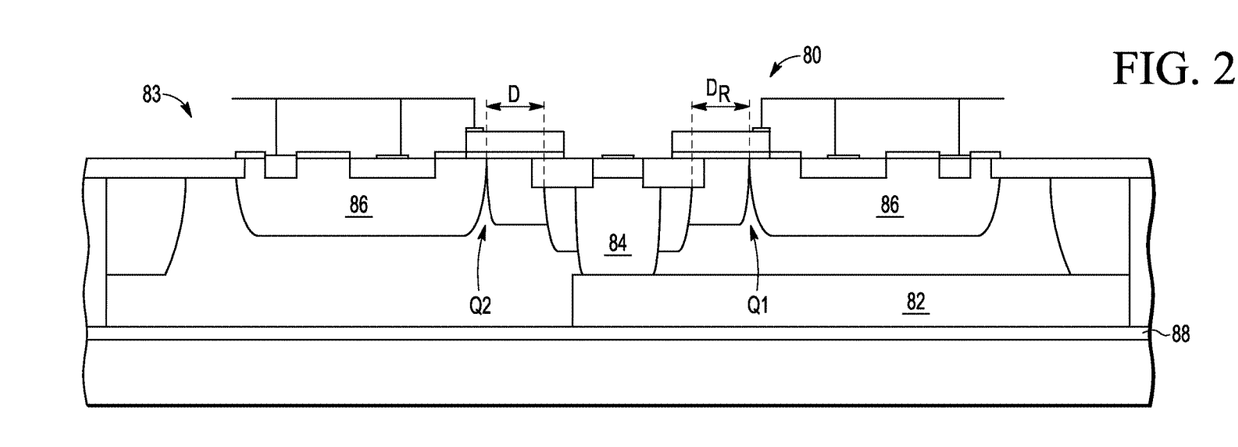
FIG. 2 is a cross-sectional, schematic, partial view of another exemplary ESD protection device configured in accordance with one embodiment.

FIG. 2 depicts an exemplary ESD protection device 80 in which a buried doped isolating layer 82 extends laterally under only a portion of a device area 83. As in the above-described example, the ESD protection device 80 includes a pair of NPN BJT devices Q1 and Q2 having a common collector region 84. An n-type buried layer (NBL) of the buried doped isolating layer 82 extends outward from the common collector region 84 under the NPN BJT device Q1. The NBL 82 does not extend laterally under a base region 86 of the other NPN BJT device Q2. Nonetheless, the base region 86 of NPN BJT device Q2 remains isolated or electrically separated from a base region 86 of the NPN BJT device Q1 due to the electrical connection between the common collector region 84 and the NBL 82. A buried oxide layer 88 extends across the device area 83 to provide substrate isolation for the ESD protection device 80.

Figure 3:
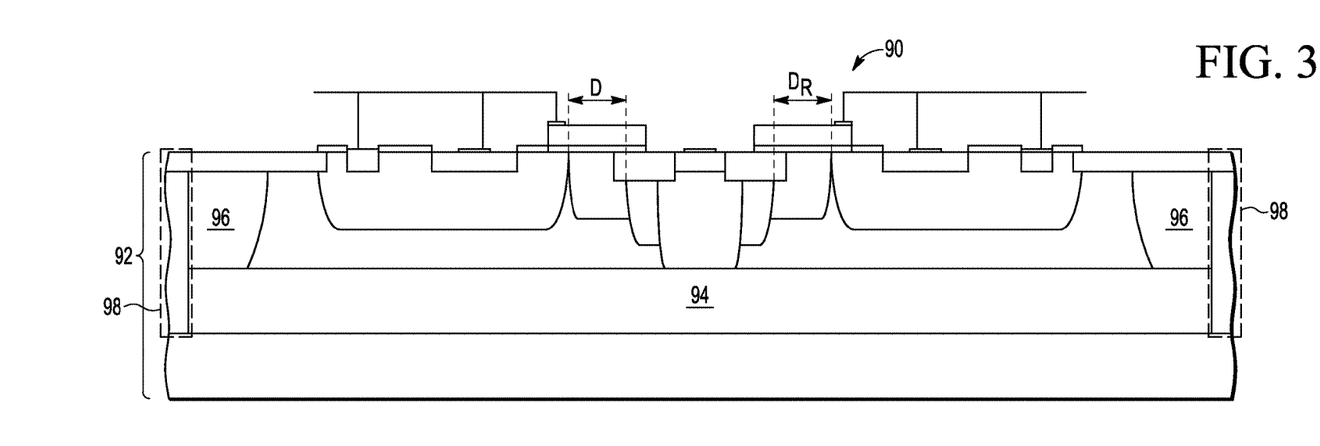
FIG. 3 is a cross-sectional, schematic, partial view of yet another exemplary ESD protection device configured in accordance with one embodiment.

FIG. 3 depicts an exemplary ESD protection device 90 isolated from a remainder of a semiconductor substrate 92 by one or more doped isolating regions or layers. In this example, an NBL 94 extends entirely across the ESD protection device 90 as described above in connection with the embodiment of FIG. 1. One or more doped isolating regions 96 provide lateral isolation as described above. The ESD protection device 90 differs from the above-described embodiments in that a buried oxide layer is not present. Deep trench isolation (DTI) regions 98 of the ESD protection device 90 are also optional, insofar as device isolation along lateral boundaries of the ESD protection device 90 may be provided via the doped isolating region(s) 96.

FIG. 4 shows an ESD protection device 100 to depict the manner in which the operational characteristics (e.g., trigger voltage level) of the disclosed embodiments may be adjusted or configured via one or more parameters of breakdown trigger regions 102. The description applies to the breakdown trigger region 102 of either NPN BJT device Q1, Q2 of the ESD protection device 100. The lateral width D of the breakdown trigger region 102 includes a component Da and a component Dd. In this example, the lateral width equals the sum of the two components, i.e., D=Da+Dd. The component Dd overlaps with an STI region 104, while the component Da does not overlap with the STI region 104, and instead disposed in an active area of a device area 106.

The breakdown trigger voltage level may be customized via adjustments to one or both of the components of the lateral width. For example, each component of the lateral width provides a separate or independent design parameter for optimization of the breakdown trigger voltage level.

Further customization of the operational characteristics of the ESD protection device 100 may be achieved by adjusting a lateral spacing S between a gate structure 108 and an emitter region 110. The length of the spacing S may be equal to or greater than zero. In the latter case, no inversion channel is formed under the gate structure 108, thereby avoiding potential leakage current. The former case may be used, insofar as the gate structure 108 has the same potential as the emitter region 110, as described herein.

The dual polarity ESD protection device 20 need not be symmetrical. For example, the breakdown voltage trigger level need not be at the same level for the two directions. In some embodiments, the lateral widths $D_R$ and D may differ. The ESD protection device 20 also need not be bidirectional. For example, the ESD protection device 20 may include a single NPN BJT device connected to one I/O terminal and a p-type well region configured similarly to one of the base regions 48 connected to the other I/O terminal.

The above-described devices are shown in simplified form. For example, FIGS. 1-4 do not show the conductive (e.g., ohmic) contacts and other metal layers configured for electric coupling with the various regions and structures of the devices. The devices may have a number of other structures or components for connectivity, isolation, passivation, and other purposes not shown in FIGS. 1-4 for ease in illustration. For instance, the devices may include any number of additional isolating regions or layers (e.g., in addition to those described above and in addition to the silicide blocks shown).

The dopant concentrations, thicknesses, and other characteristics of the above-described semiconductor regions in the semiconductor substrate 22 may vary. In one example of the embodiment shown in FIG. 1, the above-referenced semiconductor regions may have the following approximate concentrations and thicknesses:

|  | Concentration | Thickness |
|---|---|---|
| epitaxial 24: | $1 \times 10^{15}$-$8 \times 10^{15}$/cm$^3$ | 3-8 μm |
| substrate 26: | $1 \times 10^{15}$-$1 \times 10^{18}$/cm$^3$ | not applicable |
| isolation 34: | $1 \times 10^{16}$-$1 \times 10^{19}$/cm$^3$ | varies to reach NBL |
| NBL 36: | $1 \times 10^{18}$-$8 \times 10^{19}$/cm$^3$ | 1-3 μm |
| base 48: | $1 \times 10^{16}$-$1 \times 10^{19}$/cm$^3$ | 0.5 μm or to any level above NBL |
| emitter 50: | $5 \times 10^{19}$-$5 \times 10^{21}$/cm$^3$ | 0.15-0.3 μm |
| contact 52: | $1 \times 10^{19}$-$5 \times 10^{21}$/cm$^3$ | 0.15-0.3 μm |
| trigger 56: | $1 \times 10^{16}$-$1 \times 10^{17}$/cm$^3$ | 0.3 μm or to any level above NBL |
| inner region 60: | $1 \times 10^{16}$-$8 \times 10^{19}$/cm$^3$ | Any to reach NBL |
| outer region 62: | Equal or lighter than region 60 | Equal or shallower than region 60 |

The concentrations and thicknesses may be different in other embodiments. For example, the dopant concentration of the original substrate 26 may vary considerably.

Figure 5:
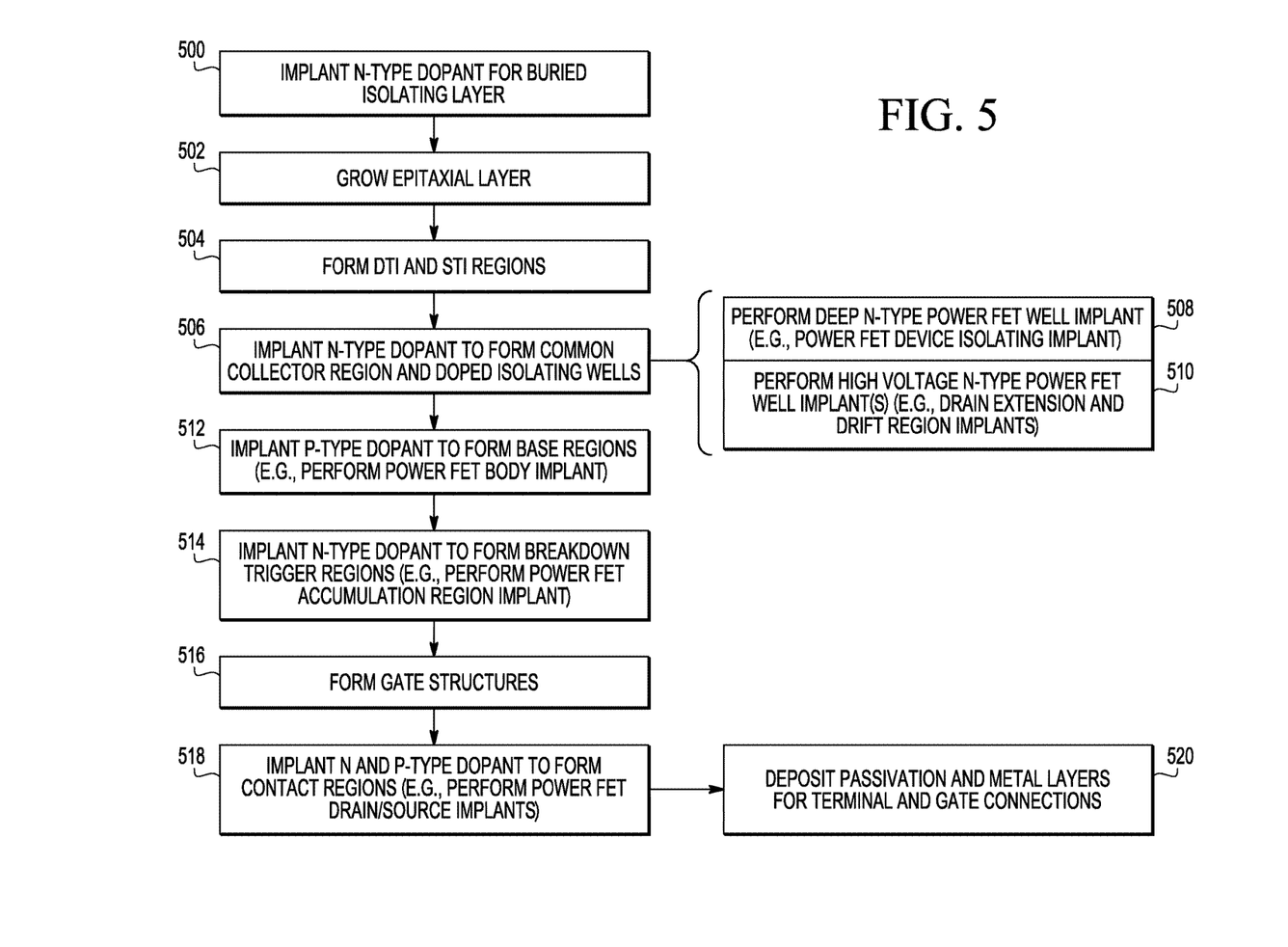
FIG. 5 is a flow diagram of an exemplary fabrication sequence to construct an ESD protection device having a breakdown trigger region in accordance with one embodiment.

FIG. 5 shows an exemplary fabrication method for fabricating an ESD protection device in an electronic apparatus having a power field effect transistor (FET) device. The ESD protection device is configured to protect the power FET device from ESD events. The method may be directed to fabricating a dual polarity ESD protection device having one or more of the features described above to emulate the blocking junction of the power FET device. The ESD protection device is fabricated with a semiconductor substrate, the regions or layers of which may have the conductivity types of the examples described above, or be alternatively configured with opposite conductivity types. The method includes a sequence of acts, only the salient of which are depicted for convenience in illustration. The ordering of the acts may vary in other embodiments. For example, one or more implants directed to forming a common collector region may be implemented after an implant directed to forming a base region. The fabrication method is not limited to any particular doping mechanism, and may include future developed doping techniques.

The method may begin with, or include, an act 500 in which an n-type layer is formed via, e.g., an n-type implant procedure, in either an n-type or p-type original semiconductor substrate. An n-type or p-type epitaxial layer is then grown on the original semiconductor substrate in an act 502. With the growth of the epitaxial layer, the n-type layer is configured as a buried device isolation layer. The buried device isolation layer(s) may be patterned via a mask to extend across all or part of a device area of the ESD protection device. Any number of epitaxial layers may be grown.

Any number of STI and DTI regions are then formed in the substrate in an act 504. The STI and DTI regions may be formed via any now known or hereafter developed procedure. For example, the act 504 may include the formation of a trench and the deposition (e.g., chemical vapor deposition, or CVD) of one or more materials in the trench. In some embodiments, the trench is filled with silicon oxide. Additional or alternative materials may be deposited to fill the trench or to damage the substrate. In an alternative embodiment, the STI and/or DTI regions are formed after one or more regions or components of the ESD protection device are formed.

In an act 506, one or more collector regions of the ESD protection device are formed in the semiconductor substrate via one or more dopant implant procedures used to form one or more regions of the power FET device. In some embodiments, the implants are configured to implant n-type dopant. In the exemplary method of FIG. 5, a composite collector region is formed via an act 508 in which a deep n-type power FET implant is performed and an act 510 in which one or more high voltage n-type power FET implants are performed. The deep n-type power FET implant(s) may be configured to form one or more device isolating regions or wells of the power FET device (e.g., wells or regions that form an isolation tub for an LDMOS device). The high voltage n-type power FET implant(s) used to form the composite collector region may be configured to form one or more n-type wells of the power FET device configured to withstand high voltage levels, such as a high drain-source voltage levels. For example, the high voltage n-type power FET implant(s) may be configured to form a drift region and/or a drain extension region of an LDMOS device.

The patterns for the power FET implants used to form the composite collector region may overlap. For example, the composite collector region may include inner and outer regions as described above (see, e.g., inner well region 60 and outer well region 62 of FIG. 1), where the inner region is doped by both of the above-referenced power FET implants and the outer region is doped by only one of the power FET implants. Both the inner and outer regions may be further doped by an implant directed to forming the breakdown trigger region described herein.

In an act 512, one or more base regions of the ESD protection device are formed in the semiconductor substrate via a dopant implant procedure used to form one or more regions of the power FET device. The dopant type (e.g., p-type) is opposite that of the collector implants. The dopant implant may be directed to forming a body region of the power FET device, such as a body of an LDMOS device. A mask for the dopant implant procedure spaces the base region from the collector region as described above.

In an act 514, one or more breakdown trigger regions are formed in the semiconductor substrate laterally between the base region and the collector region via another implant procedure. In this example, the implant procedure is an n-type implant. The implant procedure may be directed to forming an accumulation region of the power FET device. The implant procedure may be alternatively or additionally directed to forming the region of the power FET device that establishes a blocking junction of the power FET device, such as a region in which charge carriers accumulate, drift, or otherwise flow after exiting an inversion channel of the power FET device during operation. The implant procedure may be configured such that a lower boundary of the breakdown trigger region is shallower than a depth at which the collector region reaches the NBL or other doped buried isolating layer. The implant procedure may also be configured via a mask to pattern the breakdown trigger region to laterally overlap with one of the STI regions to a desired extent.

After formation of the breakdown trigger region(s), a gate structure is formed over the breakdown trigger region in an act 516. The formation of the gate structure may include a number of constituent acts, including, for instance, growth or deposition of a gate oxide layer and deposition of a polysilicon or other conductive layer on the gate oxide layer. One or both of these constituent acts may be configured to form one or more gate structures of the power FET device. In some cases, the gate oxide layer of the ESD protection device may be thicker than the gate oxide layer of the power FET device, and thus involve a different growth or deposition procedure.

After formation of the gate structure(s), respective contact regions are formed for the base and collector regions in an act 518. The contact regions may be formed by n-type and p-type source/drain implants for the power FET device. One or more emitter regions may be formed by the n-type implant as well.

After the base contact and emitter regions are formed, the surface of the semiconductor substrate may be passivated via deposition of one or more dielectric layers in an act 520. The passivation or dielectric layers may be patterned to allow one or more conductive (e.g., metal) layers to be deposited in the act 520 to establish the above-described electrical connections, such as the interconnects linking the gate structure, the base and emitter regions, and the I/O terminals.

Additional acts may be implemented at various points during the fabrication procedure. For example, one or more metal layers may be deposited or otherwise formed. Any number of additional passivation layers may be deposited or formed to allow interconnects to be defined in such additional layers.

Figure 6:
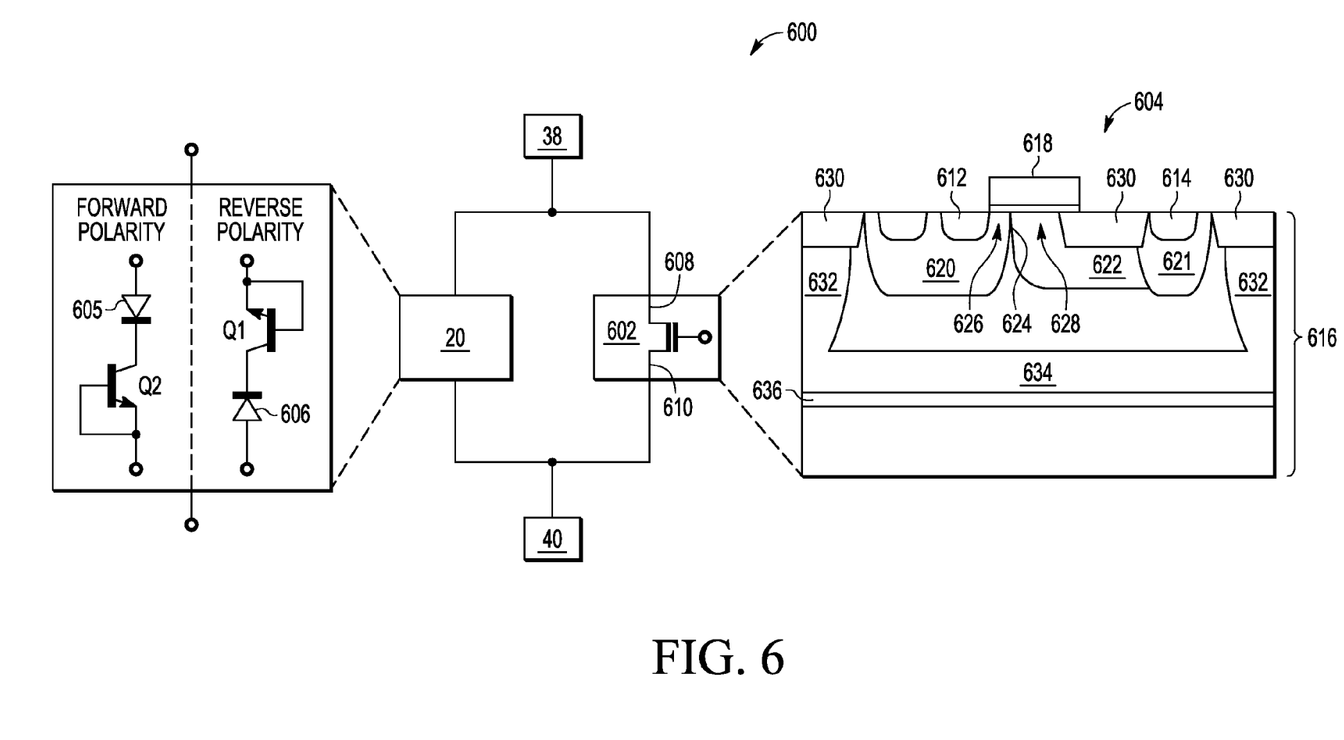
FIG. 6 is a schematic view of an exemplary circuit having a power field effect transistor (FET) device protected by the exemplary ESD protection device of FIG. 1 in accordance with one embodiment.

FIG. 6 shows an exemplary circuit 600 having a power field effect transistor (FET) device 602 protected by an ESD protection device, such as the ESD protection device 20 (FIG. 1). In this embodiment, the power FET device 602 and the ESD protection device 20 are connected in parallel across the anode and cathode terminals 38, 40. The circuit arrangement may differ in other embodiments. The power FET device 602 may include an LDMOS device 604, a portion of which is shown in cross-section. The power FET device 602 may include any number of LDMOS or other transistor devices.

As described above, the ESD protection device 20 may be a dual polarity device. In this embodiment, the ESD protection device 20 includes a pair of BJT devices Q1, Q2 (see, e.g., the BJT devices 42, 44 of FIG. 1) configured to form a parasitic SCR device upon the occurrence of an ESD event. The BJT devices Q1, Q2 are shown separately despite sharing a common collector region, as described above. The BJT devices Q1, Q2 are also depicted for both forward and reverse polarity ESD events. During operation, one of the BJT devices Q1, Q2 acts as a forward biased diode, as described above. In a forward polarity ESD event in which the anode terminal 38 is higher than the cathode terminal 40, the BJT device Q1 acts as a diode 605. In a reverse polarity ESD event, the BJT device Q2 acts as a diode 606.

The LDMOS device 604 includes source and drain electrodes 610, 608 electrically connected to source and drain regions 612, 614 in a semiconductor substrate 616 in which the BJT devices Q1, Q2 are also formed. The LDMOS device 604 includes a gate structure 618 laterally disposed between the source and drain regions 612, 614. The gate structure 618 may be formed via the same process steps used to form the gate structures of the ESD protection device 20. The source region 612 is disposed in a body region 620 formed via a power FET implantation procedure that may be used to also form the base regions of the BJT devices Q1, Q2, as described above. In this embodiment, the drain region 614 may be disposed in a drain extension region 621, which may be formed via a power FET implantation procedure also used to form an outer portion of the common collector region of the BJT devices Q1, Q2. The drain extension region 621 is disposed adjacent to a drift region 622, which may be formed via a power FET implantation procedure also used to form the above-described breakdown trigger regions. The shape, size, and other characteristics of the drain region 614 may vary from the example shown. For example, the drain region 614 may be disposed in the drift region 622 rather than the drain extension region 621.

A blocking junction 624 is defined under the gate structure 618 at an interface between the body region 620 and the drift region 622. The ESD protection device 20 is configured to shunt ESD current between the anode and cathode terminals 38, 40 before breakdown of the blocking junction 624 occurs. The blocking junction 624 is disposed between a channel 626 in the body region 620 in which charge inversion occurs during operation and an accumulation region 628 in which the charge carriers accumulate during operation before drifting through the drift region 622. The accumulation region 628 and the drift region 622 may thus form portions of a conduction path of the LDMOS device 602.

The breakdown trigger junctions of the ESD protection device 20 may be configured to mirror the blocking junction 624, as described above. For instance, the same power FET implantation procedures used to define the conduction path regions on either side of the blocking junction 624 are used to define the regions on either side of the breakdown trigger junction of the ESD protection device 20.

A number of other regions and features of the LDMOS device 604 may mirror the regions and features of the ESD protection device 20, such as STI regions 630, doped isolation regions 632, an NBL 634, and a buried oxide layer 636. A power FET implantation procedure used to form the doped isolation regions 632 may also be used to form an inner portion of the common collector region of the ESD protection device 20, as described above.

In a first aspect, an electrostatic discharge (ESD) protection device includes a semiconductor substrate, a base region in the semiconductor substrate and having a first conductivity type, an emitter region in the base region and having a second conductivity type, a collector region in the semiconductor substrate, spaced from the base region, and having the second conductivity type, a breakdown trigger region having the second conductivity type, disposed laterally between the base region and the collector region to define a junction across which breakdown occurs to trigger the ESD protection device to shunt ESD discharge current, and a gate structure supported by the semiconductor substrate over the breakdown trigger region and electrically tied to the base region and the emitter region. The lateral width of the breakdown trigger region is configured to establish a voltage level at which the breakdown occurs.

In a second aspect, an electronic apparatus includes a semiconductor substrate, a pair of terminals supported by the semiconductor substrate, and a dual polarity electrostatic discharge (ESD) protection device including a pair of bipolar transistor devices sharing a common collector region. Each bipolar transistor includes base and emitter regions in the semiconductor substrate and electrically connected to a respective one of the pair of terminals, a breakdown trigger region in the semiconductor substrate laterally between the base region and the common collector region to define a junction across which breakdown occurs to trigger the dual polarity ESD protection device, and a gate structure supported by the semiconductor substrate over the junction and electrically connected to a respective one of the terminals and to the base and emitter regions. The lateral width of the breakdown trigger region is configured to establish a voltage level at which the breakdown occurs.

In a third aspect, a method of fabricating an electrostatic discharge (ESD) protection device in an electronic apparatus including a power field effect transistor (FET) device. The method includes forming a base region in a semiconductor substrate via a first implantation of dopant of a first conductivity type, forming a collector region spaced from the base region in the semiconductor substrate via implantation of dopant of a second conductivity type, and forming a breakdown trigger region in the semiconductor substrate laterally between the base region and the collector region via a second implantation of dopant of the second conductivity type. The second implantation is configured to form a conduction path region of the power FET device in which charge carriers flow after exiting an inversion channel of the power FET device during operation Semiconductor devices with a conductive gate electrode positioned over a dielectric or other insulator may be considered MOS devices, despite the lack of a metal gate electrode and an oxide gate insulator. Accordingly, the terms metal-oxide-semiconductor and the abbreviation "MOS" may be used even though such devices may not employ metals or oxides but various combinations of conductive materials, e.g., metals, alloys, silicides, doped semiconductors, etc., instead of simple metals, and insulating materials other than oxides (e.g., nitrides, oxy-nitride mixtures, etc.). Thus, as used herein, the terms MOS and LDMOS are intended to include such variations.

The present invention is defined by the following claims and their equivalents, and nothing in this section should be taken as a limitation on those claims. Further aspects and advantages of the invention are discussed above in conjunction with the preferred embodiments and may be later claimed independently or in combination.

While the invention has been described above by reference to various embodiments, it should be understood that many changes and modifications may be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. An electronic apparatus comprising an electrostatic discharge (ESD) protection device, the ESD protection device comprising:
   a semiconductor substrate;
   a base region in the semiconductor substrate and having a first conductivity type;
   an emitter region in the base region and having a second conductivity type;
   a collector region in the semiconductor substrate, spaced from the base region, and having the second conductivity type;
   a breakdown trigger region doped to effectively have the second conductivity type, and disposed laterally between the base region and the collector region to define a junction across which breakdown occurs to trigger the ESD protection device to shunt ESD discharge current; and
   a gate structure supported by the semiconductor substrate over the breakdown trigger region and electrically tied via an interconnect to the base region and the emitter region;
   wherein the lateral width of the breakdown trigger region is configured to establish a voltage level at which the breakdown occurs.

2. The electronic apparatus of claim 1, the ESD protection device further comprising a buried doped isolating layer in the semiconductor substrate, having the second conductivity type, and extending laterally across the base, emitter, and collector regions, wherein:
   the breakdown trigger region comprises a well;
   the collector region comprises a doped isolating well, having the second conductivity type, and electrically coupled to the buried doped isolating layer; and
   a lower boundary of the well of the breakdown trigger region is shallower than a depth at which the doped isolating well reaches the buried doped isolating layer.

3. The electronic apparatus of claim 2, wherein the doped isolating well and the buried doped isolating layer have higher dopant concentration levels than the breakdown trigger region.

4. The electronic apparatus of claim 2, the ESD protection device further comprising a well region in the semiconductor substrate, electrically separated from the base and emitter regions by the doped isolating well, and having the first conductivity type, wherein an ESD event forms a silicon controlled rectifier (SCR) device comprising the base, emitter, collector, and well regions, the SCR device being configured to shunt the ESD discharge current between the well region and the emitter region.

5. The electronic apparatus of claim 4, wherein:
   the well region is configured as a further base region in which a further emitter region is disposed; and
   the collector region is a common collector for the further base region and the further emitter region such that the ESD protection device is configured as a dual polarity ESD protection device.

6. The electronic apparatus of claim 5, wherein the buried doped isolating layer does not extend laterally under the further base region.

7. The electronic apparatus of claim 1, wherein the gate structure extends across an entire extent of the lateral width of the breakdown trigger region.

8. The electronic apparatus of claim 1, further comprising a shallow trench isolation (STI) region in the semiconductor substrate, wherein the STI region and the breakdown trigger region laterally overlap to an extent such that the STI region does not overlap a portion of the breakdown trigger region.

9. The electronic apparatus of claim 1, wherein the breakdown trigger region comprises a well, and the junction is established between the base region and the well of the breakdown trigger region.

10. The electronic apparatus of claim 1, wherein:
   the breakdown trigger region comprises a well;
   the semiconductor substrate comprises an epitaxial layer having the first conductivity type that defines a surface of the semiconductor substrate;
   the base, emitter, collector, and breakdown trigger regions are disposed in the epitaxial layer; and
   the base region and the well of the breakdown trigger region laterally abut one another to define the junction such that the junction is not defined by the epitaxial layer.

11. The electronic apparatus of claim 10, wherein:
a dopant concentration level of the breakdown trigger region is higher than a dopant concentration level of the epitaxial layer; and
the breakdown trigger region is configured to be fully depleted when the breakdown occurs.

12. An electronic apparatus comprising:
a semiconductor substrate;
a pair of terminals supported by the semiconductor substrate; and
a dual polarity electrostatic discharge (ESD) protection device comprising a pair of bipolar transistor devices sharing a common collector region, each bipolar transistor comprising:
   base and emitter regions in the semiconductor substrate and electrically connected to a respective one of the pair of terminals, the base region having a first conductivity type, the emitter region having a second conductivity type;
   a breakdown trigger region in the semiconductor substrate laterally between the base region and the common collector region to define a junction across which breakdown occurs to trigger the dual polarity ESD protection device, the breakdown trigger region doped to effectively have the second conductivity type; and
   a gate structure supported by the semiconductor substrate over the junction and electrically connected via an interconnect to a respective one of the terminals and to the base and emitter regions;
wherein the lateral width of the breakdown trigger region is configured to establish a voltage level at which the breakdown occurs.

13. The electronic apparatus of claim 12, wherein:
the breakdown trigger region comprises a well;
the dual polarity ESD protection device further comprises a buried doped isolating layer in the semiconductor substrate, the buried doped isolating layer extending laterally across the pair of bipolar transistor devices;
the common collector region comprises a doped isolating well, and electrically coupled to the buried doped isolating layer; and
a lower boundary of the well of the breakdown trigger region is shallower than a depth at which the doped isolating well reaches the buried doped isolating layer.

14. The electronic apparatus of claim 1, wherein:
the breakdown trigger region comprises a well;
the ESD protection device further comprises a buried doped isolating layer in the semiconductor substrate, having the second conductivity type, and extending laterally across the base, emitter, and collector regions; and
the well of the breakdown trigger region is spaced from the buried doped isolating layer.

15. The electronic apparatus of claim 1, wherein:
the breakdown trigger region comprises a well;
the collector region comprises an inner well region and an outer well region that flanks the inner well region; and
the well of the breakdown trigger region abuts the outer well region.

16. The electronic apparatus of claim 12, wherein:
the breakdown trigger region comprises a well;
the dual polarity ESD protection device further comprises a buried doped isolating layer in the semiconductor substrate, the buried doped isolating layer extending laterally across the pair of bipolar transistor devices; and
the well of the breakdown trigger region is spaced from the buried doped isolating layer.

17. The electronic apparatus of claim 12, wherein:
the breakdown trigger region comprises a well;
the collector region comprises an inner well region and an outer well region that flanks the inner well region;
the inner well region has a higher dopant concentration level than the outer well region; and
the well of the breakdown trigger region abuts the outer well region.

18. The electronic apparatus of claim 12, wherein:
the breakdown trigger region comprises a well;
the semiconductor substrate comprises an epitaxial layer having the first conductivity type that defines a surface of the semiconductor substrate;
   the base, emitter, collector, and breakdown trigger regions are disposed in the epitaxial layer;
   a dopant concentration level of the breakdown trigger region is higher than a dopant concentration level of the epitaxial layer;
   the base region and the well of the breakdown trigger region laterally abut one another to define the junction such that the junction is not defined by the epitaxial layer; and
   the gate structure extends across an entire extent of the lateral width of the breakdown trigger region.

19. The electronic apparatus of claim 1, wherein the breakdown trigger region comprises a well disposed laterally between the base region and the collector region to define the junction across which breakdown occurs.

20. The electronic apparatus of claim 12, wherein the breakdown trigger region comprises a well disposed laterally between the base region and the collector region to define the junction across which breakdown occurs.

21. The electronic apparatus of claim 12, further comprising a shallow trench isolation (STI) region in the semiconductor substrate, wherein the STI region and the breakdown trigger region laterally overlap to an extent such that the STI region does not overlap a portion of the breakdown trigger region.

* * * * *